(12) United States Patent
Kim et al.

(10) Patent No.: US 11,182,037 B2
(45) Date of Patent: Nov. 23, 2021

(54) DISPLAY DEVICE

(71) Applicant: SAMSUNG DISPLAY CO., LTD., Yongin-si (KR)

(72) Inventors: Eunbyul Kim, Yongin-si (KR); Myonghoon Roh, Yongin-si (KR); Boyoul Shim, Yongin-si (KR); Changwoo Won, Yongin-si (KR); Seungjin Lim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/821,800

(22) Filed: Mar. 17, 2020

(65) Prior Publication Data

US 2020/0393937 A1 Dec. 17, 2020

(30) Foreign Application Priority Data

Jun. 12, 2019 (KR) .......... 10-2019-0069554

(51) Int. Cl.
*G06F 3/044* (2006.01)
*H01L 23/00* (2006.01)
*H01L 25/18* (2006.01)
*H01L 27/32* (2006.01)
*H01L 51/52* (2006.01)

(52) U.S. Cl.
CPC .......... *G06F 3/0446* (2019.05); *H01L 24/05* (2013.01); *H01L 24/16* (2013.01); *H01L 25/18* (2013.01); *H01L 27/323* (2013.01); *H01L 27/3258* (2013.01); *H01L 27/3276* (2013.01); *H01L 51/5253* (2013.01); *G06F 2203/04103* (2013.01); *H01L 2224/16145* (2013.01)

(58) Field of Classification Search
CPC ......... G06F 3/0446; G06F 2203/04103; H01L 24/16; H01L 27/323; H01L 25/18; H01L 27/3258; H01L 24/05; H01L 51/5253; H01L 27/3276; H01L 2224/16145
See application file for complete search history.

(56) References Cited

U.S. PATENT DOCUMENTS

| 8,310,645 | B2 | 11/2012 | Matsui et al. |
| 8,542,331 | B2 | 9/2013 | Yoon et al. |
| 8,975,762 | B2 * | 3/2015 | Egawa ............ H01L 23/50 257/786 |

(Continued)

FOREIGN PATENT DOCUMENTS

| JP | 5226070 B2 | 3/2013 |
| KR | 10-1574600 B1 | 12/2015 |

(Continued)

*Primary Examiner* — Vinh T Lam
(74) *Attorney, Agent, or Firm* — Lewis Roca Rothgerber Christie LLP (57) ABSTRACT

A display device includes a substrate including a display area, a peripheral area outside the display area, and a pad area within the peripheral area; a testing circuit unit disposed within the pad area; a cover layer covering the testing circuit unit; an output pad disposed within the pad area and arranged between the testing circuit unit and the display area; an input pad disposed within the pad area, disposed at an opposite side with respect to the plurality of output pads; and a protective layer covering the output pad and the input pad, and, on a plane, an end of the protective layer is apart from the cover layer.

20 Claims, 7 Drawing Sheets

(56) References Cited

U.S. PATENT DOCUMENTS

| | | | |
|---|---|---|---|
| 9,076,990 B2* | 7/2015 | Nakamura | H01L 51/5203 |
| 9,721,914 B2 | 8/2017 | Kang | |
| 9,773,854 B2* | 9/2017 | Jung | H01L 51/5246 |
| 9,775,248 B2* | 9/2017 | Kim | H01L 27/3276 |
| 10,366,727 B2* | 7/2019 | Seo | H01L 23/544 |
| 10,840,159 B2* | 11/2020 | Park | H01L 22/32 |
| 2016/0071463 A1* | 3/2016 | Takahashi | H01L 27/3262 |
| | | | 345/76 |
| 2016/0218289 A1 | 7/2016 | Lee et al. | |
| 2017/0074923 A1* | 3/2017 | Su | H01L 21/4853 |
| 2017/0125314 A1* | 5/2017 | Lim | H01L 24/16 |
| 2017/0287939 A1* | 10/2017 | Okamae | H01L 22/32 |
| 2017/0350933 A1* | 12/2017 | Uematsu | H01L 23/49838 |
| 2018/0047804 A1* | 2/2018 | Zhou | G09G 3/2092 |
| 2018/0158894 A1* | 6/2018 | Park | H01L 51/0031 |
| 2019/0058027 A1* | 2/2019 | Kim | H01L 27/3262 |
| 2019/0067406 A1* | 2/2019 | Lee | H01L 27/1262 |
| 2019/0163304 A1* | 5/2019 | Shim | H01L 27/323 |
| 2019/0223289 A1* | 7/2019 | Kim | G02F 1/136277 |
| 2019/0319082 A1* | 10/2019 | Nam | H01L 27/1218 |
| 2020/0176383 A1* | 6/2020 | Arvin | H01L 21/4853 |
| 2020/0356195 A1* | 11/2020 | Tang | G06F 3/0446 |
| 2020/0357855 A1* | 11/2020 | Tang | G06F 3/0412 |
| 2020/0357874 A1* | 11/2020 | Gai | H01L 27/3276 |

FOREIGN PATENT DOCUMENTS

| | | |
|---|---|---|
| KR | 10-2016-0078747 A | 7/2016 |
| KR | 10-2016-0091526 A | 8/2016 |

\* cited by examiner

DISPLAY DEVICE

CROSS-REFERENCE TO RELATED APPLICATION

This application claims priority to and the benefit of Korean Patent Application No. 10-2019-0069554, filed on Jun. 12, 2019 in the Korean Intellectual Property Office, the entire disclosure of which is incorporated herein by reference.

BACKGROUND

1. Field

Aspects of one or more embodiments relate to a display device.

2. Description of Related Art

With the rapid development of display devices for visually representing various electrical signal information, a variety of flat panel display devices having excellent characteristics, such as slimness, light weight, and low power consumption, has been studied and developed. These display devices may display an image in response to a signal applied by a driving integrated circuit (IC).

Generally, the driving IC may be electrically connected to a display device via a chip-on-glass (COG) method, a tape carrier package (TCP) method, or a chip-on-film (COF) method. The COG method has a simpler structure than that of the TCP method or the COF method and thus has been widely used.

In the COG method, after the driving IC is placed on a display panel having a circuit pattern formed thereon, the driving IC is heated and pressed and then is directly mounted on the display panel. Thus, when the driving IC is mounted using the COG method, pressure is applied to the display panel. Thus, the display panel may be damaged.

SUMMARY

According to an aspect of one or more embodiments, a display device in which the occurrence of damage in a display panel is minimized or reduced when a driving integrated circuit (IC) is mounted using a chip-on-glass (COG) method is provided.

Additional aspects will be set forth, in part, in the description which follows and, in part, will be apparent from the description, or may be learned by practice of the presented embodiments of the disclosure.

According to one or more embodiments, a display device includes a substrate including a display area, a peripheral area outside the display area, and a pad area within the peripheral area; a testing circuit unit disposed within the pad area; a cover layer covering the testing circuit unit; an output pad disposed within the pad area and arranged between the testing circuit unit and the display area; an input pad disposed within the pad area, disposed at an opposite side to the output pad with the testing circuit unit therebetween; and a protective layer covering the output pad and the input pad, wherein, on a plane, an end of the protective layer is apart from the cover layer.

The testing circuit unit may include a plurality of transistors, and gate electrodes of the plurality of transistors may be electrically connected to one another.

The gate electrodes may be configured as a gate line that extends in a first direction.

The display device may further include a plurality of data lines that extend to cross the display area in a second direction perpendicular to the first direction, wherein each of the plurality of transistors is electrically connected to a corresponding data line of the plurality of data lines.

The display device may further include a driving chip including an input bump and an output bump and mounted in the pad area; and an adhesive insulation resin layer in which conductive balls are dispersed, and disposed between the pad area and the driving chip, and by using the conductive balls, the input bump is electrically connected to the input pad, and the output bump is electrically connected to the output pad.

The driving chip may be disposed on the cover layer.

Each of the plurality of transistors may further include a source electrode and a drain electrode, which are disposed on the gate electrode, and an interlayer insulating layer may be disposed between the gate electrode and the source electrode and the drain electrode, and the input pad and the output pad may be disposed on the interlayer insulating layer.

Between the end of the protective layer and the cover layer, the interlayer insulating layer may be in direct contact with the adhesive insulation resin layer.

The display device may further include a display panel including the substrate, and an input sensing unit on the display panel, wherein the input sensing unit includes a first touch insulating layer disposed on the display panel, a bridge wire on the first touch insulating layer, a second touch insulating layer on the bridge wire, and a first sensing electrode and a second sensing electrode on the second touch insulating layer, and the protective layer includes at least one of the first touch insulating layer and the second touch insulating layer.

The display device may further include an additional output pad disposed on the protective layer and connected to the output pad, and an additional input pad disposed on the protective layer and connected to the input pad, and the additional output pad and the additional input pad may include a same material as the first sensing electrode and the second sensing electrode.

According to one or more embodiments, a display device includes a display panel; an input sensing unit disposed on the display panel; and a driving chip mounted on the display panel, wherein the display panel includes a substrate including a display area, a peripheral area outside the display area, and a pad area within the peripheral area; a testing circuit unit disposed within the pad area; a cover layer covering the testing circuit unit; an output pad disposed within the pad area and arranged between the testing circuit unit and the display area; and an input pad disposed at an opposite side to the output pad with the testing circuit unit therebetween, wherein the driving chip is disposed on the cover layer, and an input bump of the driving chip is electrically connected to the input pad, and an output bump of the driving chip is electrically connected to the output pad.

The display panel may further include a protective layer covering the output pad and the input pad, and an end of the protective layer around the cover layer may be apart from the cover layer.

The input sensing unit may include a first touch insulating layer disposed on the display panel, a bridge wire on the first touch insulating layer, a second touch insulating layer on the bridge wire, and a first sensing electrode and a second sensing electrode on the second touch insulating layer, and the protective layer may include at least one of the first touch insulating layer and the second touch insulating layer.

The display panel may further include an additional output pad disposed on the protective layer and connected to the output pad, and an additional input pad disposed on the protective layer and connected to the input pad, and the additional output pad and the additional input pad may include a same material as the first sensing electrode and the second sensing electrode.

The display panel may further include a thin-film transistor disposed within the display area, an organic light-emitting device electrically connected to the thin-film transistor, and a planarization layer between the thin-film transistor and the organic light-emitting device, and the protective layer may include a same material as the planarization layer.

The testing circuit unit may include a plurality of transistors, and gate electrodes of the plurality of transistors may be configured as a gate line that extends in the first direction.

The display panel may further include a plurality of data lines that extend to cross the display area in a second direction perpendicular to the first direction, and each of the plurality of transistors may be electrically connected to a corresponding data line of the plurality of data lines.

The display device may further include an adhesive insulation resin layer in which conductive balls are dispersed, and disposed between the pad area and the driving chip, and by using the conductive balls, the input bump may be electrically connected to the input pad, and the output bump may be electrically connected to the output pad.

Each of the plurality of transistors may further include a source electrode and a drain electrode, which are disposed on the gate electrode, and an interlayer insulating layer may be disposed between the gate electrode and the source electrode and the drain electrode, and the input pad and the output pad may be disposed on the interlayer insulating layer.

Between an end of the protective layer and the cover layer, the interlayer insulating layer may be in direct contact with the adhesive insulation resin layer.

Other aspects, features, and advantages will be apparent from the following drawings, the following description, and the claims.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

As the present disclosure allows for various changes and numerous embodiments, some example embodiments will be illustrated in the drawings and described in further detail in the following description. The effects and features of the present disclosure, and ways to achieve them will become apparent by referring to embodiments that will be described later in further detail with reference to the drawings. However, the present disclosure is not limited to the following embodiments, but may be embodied in various forms.

It is to be understood that, although the terms "first," "second," etc. may be used herein to describe various components, these components should not be limited by these terms. Rather, these terms are used to distinguish one component from another.

As used herein, the singular forms "a," "an," and "the" are intended to include the plural forms as well, unless the context clearly indicates otherwise.

It is to be further understood that the terms "comprises" and/or "comprising" used herein specify the presence of stated features or components, but do not preclude the presence or addition of one or more other features or components.

It is to be understood that when a layer, region, or component is referred to as being "formed on" another layer, region, or component, it may be directly or indirectly formed on the other layer, region, or component. That is, for example, one or more intervening layers, regions, or components may be present.

Sizes of elements in the drawings may be exaggerated for convenience of explanation. In other words, since sizes and thicknesses of components in the drawings may be arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

Herein, some example embodiments of the present disclosure will be described below in further detail with reference to the accompanying drawings. Those components that are the same or are in correspondence may have the same reference numeral throughout the figures.

Figure 1:
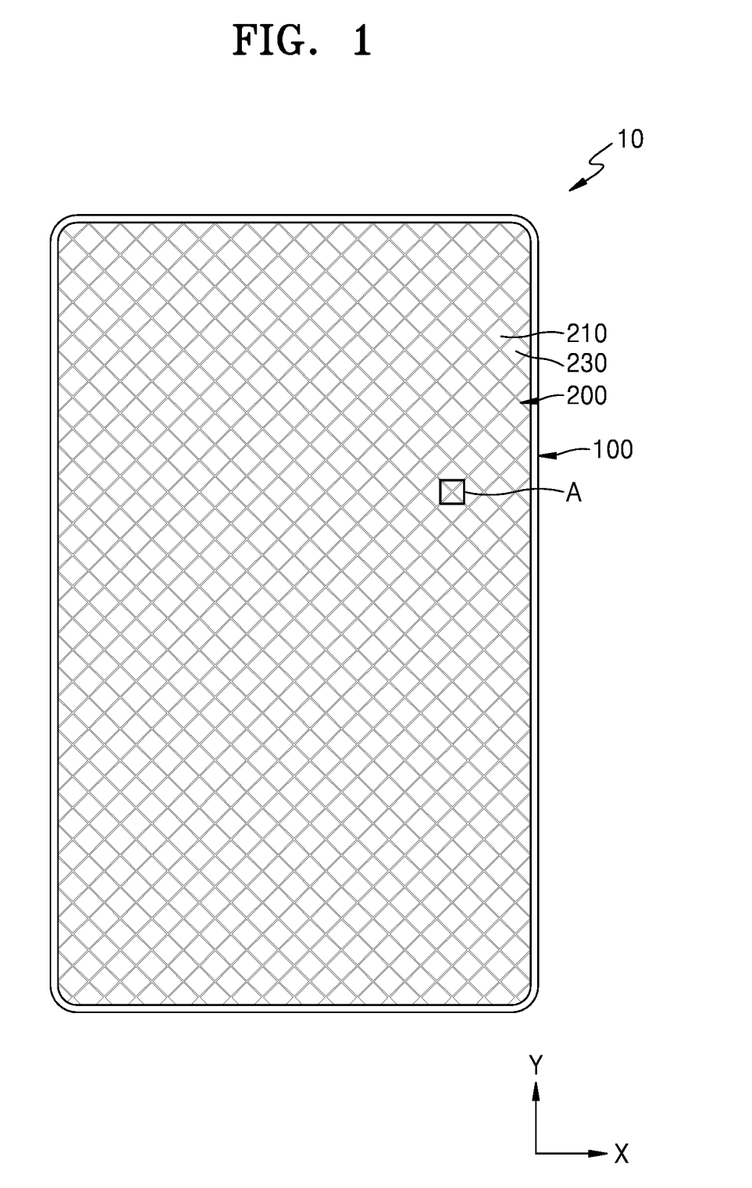
FIG. 1 is a plan view illustrating an example of a display device according to an embodiment.

FIG. 1 is a plan view illustrating an example of a display device according to an embodiment.

Referring to FIG. 1, a display device 10 may include a display panel 100 and an input sensing unit 200 disposed on the display panel 100.

The display panel 100 may display an image. The input sensing unit 200 may include first sensing electrodes 210 and second sensing electrodes 230 and may sense contact of an external touch inputting unit, such as a user's hand or a pen, so as to generate input signals.

The first sensing electrodes 210 may be connected to one another in a first direction X and constitute a plurality of first sensing electrode arrays. Also, the plurality of first sensing electrode arrays may be apart from one another in a second direction Y perpendicular to the first direction X and may be arranged in parallel to one another.

The second sensing electrodes 230 may be disposed between the first sensing electrodes 210 in the first direction X and the second direction Y and may be connected to one another in a direction that crosses the plurality of first sensing electrode arrays.

In FIG. 1, each of the first sensing electrodes 210 and the second sensing electrodes 230 is shown having a diamond shape. However, embodiments are not limited thereto, and each of the first sensing electrodes 210 and the second sensing electrodes 230 may have any of various shapes.

Figure 2:
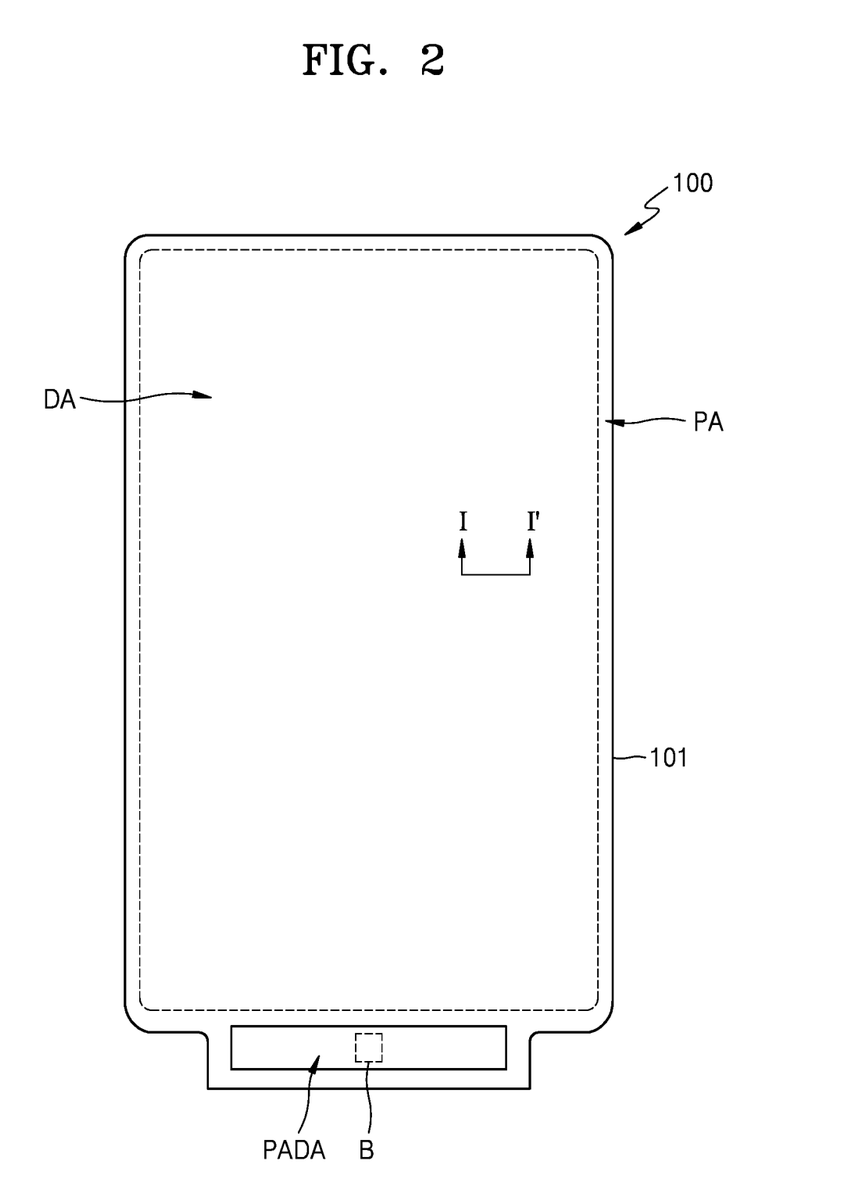
FIG. 2 is a plan view illustrating an example of a display panel of the display device of FIG. 1.
Figure 3:
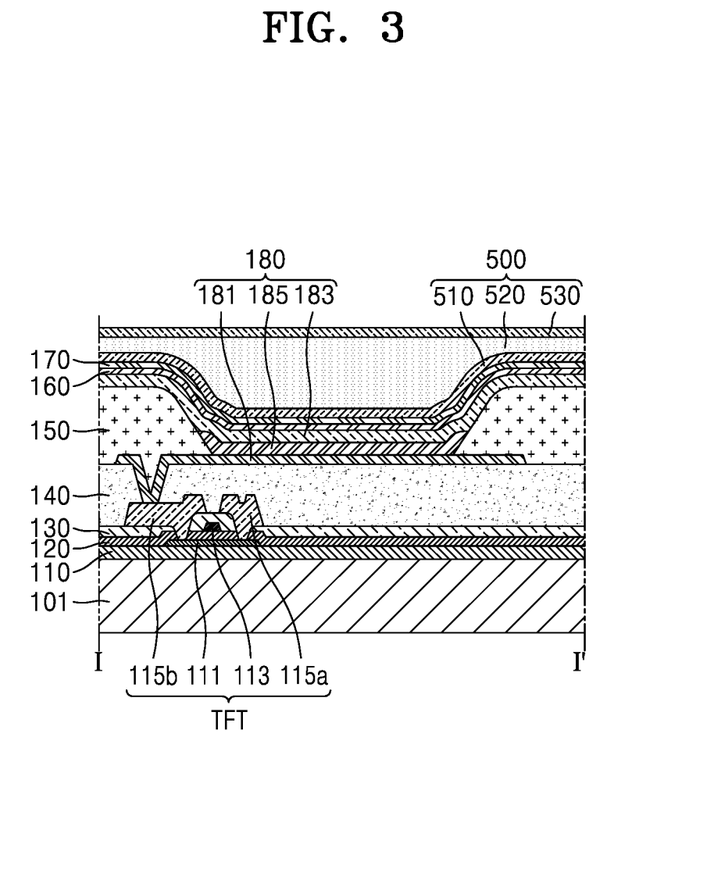
FIG. 3 is a cross-sectional view taken along the line I-I' of FIG. 2.

FIG. 2 is a plan view illustrating an example of a display panel of the display device of FIG. 1; and FIG. 3 is a cross-sectional view taken along the line I-I' of FIG. 2.

Referring to FIGS. 2 and 3, the display panel 100 may include a display area DA in which an image is displayed, and a peripheral area PA outside the display area DA. For example, a substrate 101 has the display area DA and the peripheral PA.

A plurality of display elements may be disposed in the display area DA. In an example, the plurality of display elements may be organic light-emitting display devices (OLEDs) and may emit red light, green light, blue light, or white light. The peripheral area PA may include a pad area PADA to which a variety of electronic devices or printed circuit boards (PCBs) such as driving integrated circuits (ICs) are electrically attached.

FIG. 2 is a plan view illustrating the appearance of the substrate 101 during a process of manufacturing the display panel 100. In an electronic device, such as a finally-manufactured display panel 100 or a smartphone including the display panel 100, a portion of the substrate 101 may be bent in order to minimize or reduce the area of the peripheral area PA recognized by a user. For example, the substrate 101 may be bent between the pad area PADA and the display area DA such that at least a part of the pad area PADA may overlap the display area DA. At this time, a direction of bending may be set in such a way that the pad area PADA does not shield the display area DA but, rather, the pad area PADA is behind the display area DA. Thus, the user recognizes that the display area DA takes the most part of the display device (see 10 of FIG. 1).

In an embodiment, each of left and right ends of the display area DA may be bent to have an outwardly convex shape. Thus, it may be recognized that, when the display device (see 10 of FIG. 1) is viewed from the front, there is no bezel in both ends of the display device (see 10 of FIG. 1), and the display area DA may be extended.

FIG. 3 is a cross-sectional view illustrating a part of the display panel 100 of FIG. 2, which illustrates an example in which an OLED 180 is used as a display device. However, embodiments are not limited thereto, and the display panel 100 may include a different type of display device, such as a liquid crystal device.

In an embodiment, the substrate 101 may be a flexible plastic substrate. For example, the substrate 101 may include a polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate. However, the substrate 101 may be variously modified, such that the substrate 101 may include glass or a metal, for example.

A thin-film transistor TFT is disposed in the display area DA of the substrate 101. Beside the thin-film transistor TFT, an OLED 180 to be electrically connected to the thin-film transistor TFT is also disposed in the display area DA of the substrate 101. A pixel electrode 181 of the OLED 180 is electrically connected to the thin-film transistor TFT. In an embodiment, a thin-film transistor TFT (not shown) may be disposed in the peripheral area PA of the substrate 101. The thin-film transistor TFT disposed in the peripheral area PA may be a part of a circuit unit for controlling electrical signals to be applied to the display area DA, for example.

The thin-film transistor TFT may include a semiconductor layer 111 including amorphous silicon, polycrystalline silicon, or an organic semiconductor material, a gate electrode 113, a source electrode 115a, and a drain electrode 115b. In order to prevent or substantially prevent an impurity from penetrating into the substrate 101, a buffer layer 110 including an inorganic material, such as a silicon oxide, a silicon nitride, or a silicon oxynitride, may be disposed on the substrate 101, and the semiconductor layer 111 may be disposed on the buffer layer 110.

The gate electrode 113 may be disposed above the semiconductor layer 111. The source electrode 115a and the drain electrode 115b are electrically connected to each other in response to a signal applied to the gate electrode 113. In an embodiment, the gate electrode 113 may include at least one material from among the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), and may have a single layer or multi-layer structure. In this case, in order to attain an insulation property between the semiconductor layer 111 and the gate electrode 113, a gate insulating layer 120 including an inorganic material, such as a silicon oxide, a silicon nitride, or a silicon oxynitride, may be between the semiconductor layer 111 and the gate electrode 113.

An interlayer insulating layer 130 may be disposed on the gate electrode 113. The interlayer insulating layer 130 may include an inorganic material, such as a silicon oxide, a silicon nitride, or a silicon oxynitride, and may have a single layer or multi-layer structure.

The source electrode 115a and the drain electrode 115b are disposed on the interlayer insulating layer 130. Each of the source electrode 115a and the drain electrode 115b may be electrically connected to the semiconductor layer 111 via a contact hole formed in the interlayer insulating layer 130 and the gate insulating layer 120. The source electrode 115a and the drain electrode 115b may include at least one material selected from the group consisting of Al, Pt, Pd, Ag, Mg, Au, Ni, Nd, Ir, Cr, Li, Ca, Mo, Ti, W, and Cu, for example, in consideration of conductivity and may have a single layer or multi-layer structure.

A planarization layer 140 may be disposed on the thin-film transistor TFT. For example, as shown in FIG. 3, when an OLED 180 is disposed on the thin-film transistor TFT, the planarization layer 140 may cover the thin-film transistor TFT so as to provide a flat surface. The planarization layer 140 may include an organic material, such as acryl, benzocyclobutene (BCB), or hexamethyldisiloxane (HMDSO). Although FIG. 3 illustrates the planarization layer 140 having a single layer structure, there may be various modifications, such that the planarization layer 140 may have a multi-layer structure.

The OLED 180 including the pixel electrode 181, an opposite electrode 183, and an intermediate layer 185 therebetween may be disposed on the planarization layer 140. The intermediate layer 185 may include an emission layer.

The pixel electrode 181 may be disposed on the planarization layer 140. The pixel electrode 181 may be in contact with one of the source electrode 115a and the drain electrode 115b via an opening of the planarization layer 140 and may be electrically connected to the thin-film transistor TFT.

The pixel electrode 181 may be a (semi-)transparent electrode or reflective electrode. When the pixel electrode 181 is a (semi-)transparent electrode, the pixel electrode 181 may include an indium tin oxide (ITO), an indium zinc oxide (IZO), a zinc oxide (ZnO), $In_2O_3$, an indium gallium oxide (IGO), or an aluminum-doped zinc oxide (AZO). In an embodiment, when the pixel electrode 181 is a reflective electrode, the pixel electrode 181 may include a reflective layer including any of Ag, Mg, Al, Pt, Pd, Au, Ni, Nd, Ir, Cr, and a compound thereof, and a layer including ITO, IZO, ZnO, $In_2O_3$, or AZO. The pixel electrode 181 may include any of various materials, and there may be various modifications, wherein the pixel electrode 181 may have a single layer or multi-layer structure.

A pixel-defining layer 150 may be disposed on the planarization layer 140. The pixel-defining layer 150 may have an opening corresponding to each of sub-pixels, i.e., an opening through which at least the center of the pixel electrode 181 is exposed, thereby defining a pixel. Also, as shown in FIG. 3, the pixel-defining layer 150 may increase a distance between ends of the pixel electrode 181 and the opposite electrode 183 on the pixel electrode 181, thereby preventing or substantially preventing an arc from occurring in the ends of the pixel electrode 181. The pixel-defining layer 150 may include an organic material, such as polyimide or HMDSO.

The intermediate layer 185 of the OLED 180 may include a small molecular weight material or a polymer material. When the intermediate layer 185 includes a small molecular weight material, the intermediate layer 185 may have a structure in which a hole injection layer (HIL), a hole transport layer (HTL), an emission layer (EML), an electron transport layer (ETL), and/or an electron injection layer (EIL) are stacked, and may include any of various organic materials, such as copper phthalocyanine (CuPc), N,N'-Di (naphthalene-1-yl)-N,N'-diphenyl-benzidine (NPB), and tris-8-hydroxyquinoline aluminum)($Alq_3$). These layers may be formed using a method, such as vacuum deposition.

When the intermediate layer 185 includes a polymer material, the intermediate layer 185 may have a structure including an HTL and an EML, for example. In this case, the HTL may include poly-3,4-alkenedioxythiophene (PEDOT), and the EML may include a polymer material, such as a poly-phenylenevinylene (PPV)-based polymer material and a polyfluorene-based polymer material. In an embodiment, the intermediate layer 185 may be formed using screen printing, inkjet printing, or laser induced thermal imaging (LITI). The intermediate layer 185 may have any of various structures.

The opposite electrode 183 is disposed to correspond to the display area DA. That is, the opposite electrode 183 may be integrally formed to correspond to a plurality of OLEDs 180. The opposite electrode 183 may be a (semi-)transparent electrode or a reflective electrode. When the opposite electrode 183 is a (semi-) transparent electrode, the opposite electrode 183 may have a layer including a metal having a small work function, e.g., any of lithium (Li), calcium (Ca), lithium fluoride (LiF)/Ca, LiF/Al, Ag, Mg, and a compound thereof and a (semi-)transparent conductive layer such as ITO, IZO, ZnO, or $In_2O_3$. When the opposite electrode 183 is a reflective electrode, the opposite electrode 183 may have a layer including any of Li, Ca, LiF/Ca, LiF/Al, Al, Ag, Mg, and a compound thereof. However, the configuration and material of the opposite electrode 183 are not limited thereto, and there may be various modifications.

A capping layer 160 may be disposed on the opposite electrode 183. The capping layer 160 may improve efficiency of light generated in the OLED 180, for example, light extraction efficiency to the outside. In order to improve light efficiency, the capping layer 160 may include at least one organic or inorganic material selected from the group consisting of a silicon oxide, a silicon nitride, a zinc oxide, a titanium oxide, a zirconium oxide, an indium tin oxide, an indium zinc oxide, $Alq_3$, CuPc, CBP, a-NPB, and $ZiO_2$.

An encapsulation layer 500 may be disposed on the capping layer 160. The encapsulation layer 500 may protect the OLED 180 from external moisture or oxygen. To this end, the encapsulation layer 500 may extend in the display area DA in which the OLED 180 is disposed, and in the peripheral area PA outside the display area DA. In an embodiment, the encapsulation layer 500 may have a multi-layer structure, as shown in FIG. 3. In an embodiment, the encapsulation layer 500 may include a first inorganic encapsulation layer 510, an organic encapsulation layer 520, and a second inorganic encapsulation layer 530.

In an embodiment, the first inorganic encapsulation layer 510 may cover the capping layer 160 and may include any of a silicon oxide, a silicon nitride, and a silicon oxynitride. As the first inorganic encapsulation layer 510 is formed along a lower structure thereof, a top surface thereof may not be flat, as shown in FIG. 3.

In an embodiment, because the organic encapsulation layer 520 may cover the first inorganic encapsulation layer 510 and may have a sufficient thickness, a top surface of the organic encapsulation layer 520 may be substantially flat over the entire display area DA. In an embodiment, the organic encapsulation layer 520 may include at least one material selected from the group consisting of polyethylene terephthalate, polyethylene naphthalate, polycarbonate, polyimide, polyethylene sulfonate, polyoxymethylene, polyarylate, and hexamethyldisiloxane.

In an embodiment, the second inorganic encapsulation layer 530 may cover the organic encapsulation layer 520 and may include any of a silicon oxide, a silicon nitride, and a silicon oxynitride. The second inorganic encapsulation layer 530 may extend to the outside of the organic encapsulation layer 520 and may be in contact with the first inorganic encapsulation layer 510 such that the organic encapsulation layer 520 may not be exposed to the outside.

In this way, the encapsulation layer 500 may include the first inorganic encapsulation layer 510, the organic encapsulation layer 520, and the second inorganic encapsulation layer 530. Thus, through the multi-layer structure, even when cracks occur in the encapsulation layer 500, these cracks may not be connected between the first inorganic encapsulation layer 510 and the organic encapsulation layer 520 or between the organic encapsulation layer 520 and the second inorganic encapsulation layer 530. Thus, a path on which external moisture or oxygen penetrates into the display area DA may be prevented or substantially prevented from being formed, or the formation of the path may be minimized or reduced.

While the encapsulation layer 500 is formed, lower structures thereof may be damaged. For example, the first inorganic encapsulation layer 510 may be formed using chemical vapor deposition (CVD). When the first inorganic encapsulation layer 510 is formed using CVD, a layer on which the first inorganic encapsulation layer 510 is formed may be damaged. Thus, when the first inorganic encapsulation layer 510 is formed directly on the capping layer 160, the capping layer 160 that improves efficiency of light generated in the OLED 180 may be damaged such that light efficiency of the display device may be deteriorated. Thus, in an embodiment, in order to prevent or substantially prevent the capping layer 160 from being damaged when the encapsulation layer 500 is formed, a protective layer 170 may be between the capping layer 160 and the encapsulation layer 500. In an embodiment, the protective layer 170 may include LiF.

Figure 4:
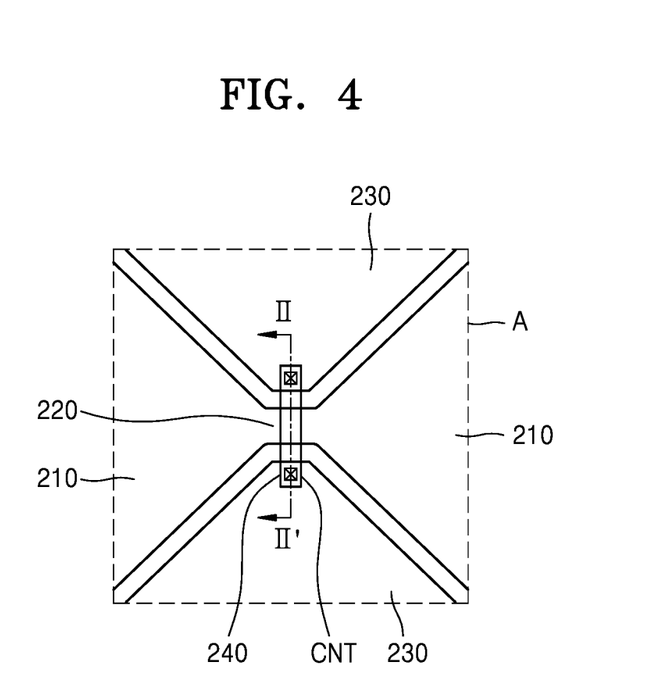
FIG. 4 is a plan view illustrating a region "A" of FIG. 1.
Figure 5:
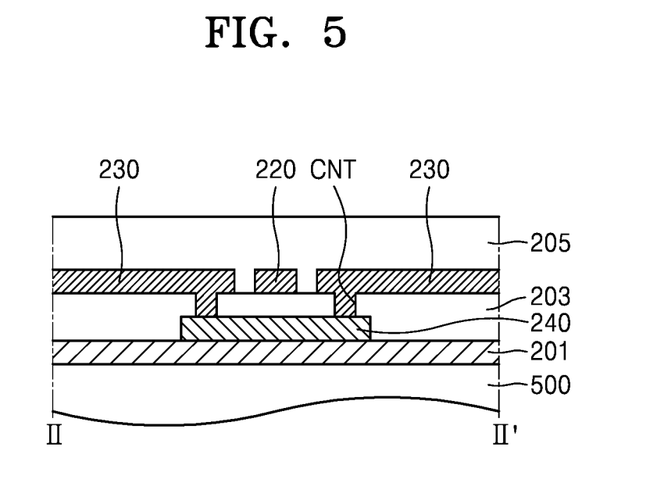
FIG. 5 is a cross-sectional view taken along the line II-II' of FIG. 4.

FIG. 4 is a plan view illustrating a region "A" of FIG. 1; and FIG. 5 is a cross-sectional view taken along the line II-II' of FIG. 4.

Referring to FIGS. 4 and 5, the input sensing unit (see 200 of FIG. 1) may be formed directly on the display panel (see 100 of FIG. 1). For example, the input sensing unit (see 200 of FIG. 1) may be formed directly on the encapsulation layer 500. Thus, the thickness of the display device (see 10 of FIG. 1) may be reduced. In another example, after the input sensing unit (see 200 of FIG. 1) is formed on a substrate (not shown), the substrate (not shown) may be bonded to the encapsulation layer 500.

The first sensing electrodes 210 and the second sensing electrodes 230 may include transparent conductive layers. A transparent conductive layer may include a transparent conductive oxide, such as an ITO, an IZO, a ZnO, or an indium tin zinc oxide (ITZO). In an embodiment, the transparent conductive layer may include a conductive polymer, such as any of PEDOT, metal nanowires, and graphene. In another example, the first sensing electrodes 210 and the second sensing electrodes 230 may include opaque metal layers. In an embodiment, for permeability, the first sensing electrodes 210 and the second sensing electrodes 230 may have mesh shapes.

Two first sensing electrodes 210 that are adjacent to each other in the first direction X may be connected to each other using a connection part 220. The connection part 220 may be disposed on a same layer as the first sensing electrodes 210. The connection part 220 may be formed integrally with the first sensing electrodes 210.

Two second sensing electrodes 230 that are adjacent to each other in the second direction Y perpendicular to the first direction X may be connected to each other using a bridge wire 240. The bridge wire 240 may be disposed on a different layer from the first sensing electrodes 210 and the second sensing electrodes 230. In an embodiment, the bridge wire 240 may be disposed under the first sensing electrodes 210 and the second sensing electrodes 230.

For example, as shown in FIG. 5, a first touch insulating layer 201 for improving an adhesive force between the encapsulation layer 500 and the input sensing unit (see 200 of FIG. 1) may be formed on the encapsulation layer 500, and the bridge wire 240 is disposed on the first touch insulating layer 201. Also, a second touch insulating layer 203 may be formed on the bridge wire 240, and the first sensing electrodes 210 and the second sensing electrodes 230 may be disposed on the second touch insulating layer 203. In this case, the bridge wire 240 and the second sensing electrodes 230 may be electrically connected to each other via a contact hole CNT formed in the second touch insulating layer 203. In an embodiment, the first touch insulating layer 201 and the second touch insulating layer 203 may include at least one of an aluminum oxide, a titanium oxide, a silicon oxide, a silicon oxynitride, a zirconium oxide, and a hafnium oxide.

In an embodiment, a third touch insulating layer 205 may be formed on the first sensing electrodes 210 and the second sensing electrodes 230. In an example, the third touch insulating layer 250 may include at least one of acryl-based resin, methacryl-based resin, polyisoprene, vinyl-based resin, epoxy-based resin, urethane-based resin, cellulose-based resin, siloxane-based resin, polyimide-based resin, polyamide-based resin, and a perylene-based resin.

Because the bridge wire 240 and the connection part 220 cross each other, the width (measured on the plane) of the bridge wire 240 may be minimized or reduced so as to reduce parasitic capacitance therebetween. In an embodiment, the bridge wire 240 may include a material having a lower resistance than that of the second sensing electrodes 230 so as to improve sensitivity. For example, the bridge wire 240 may include any of Mo, Ag, Ti, Cu, Al, and an alloy thereof.

In an embodiment, as shown in FIGS. 4 and 5, the bridge wire 240 is disposed on a lower layer than the connection part 220. However, embodiments are not limited thereto, and, in another embodiment, the bridge wire 240 may be disposed on a higher layer than the connection part 220. In an embodiment, two or more bridge wires 240 may be formed.

In an embodiment, dummy patterns each having a floating state in which they are not connected to the first sensing electrodes 210 and the second sensing electrodes 230, may be further disposed between the first sensing electrodes 210 and the second sensing electrodes 230. The dummy patterns may be formed on a same layer as the first sensing electrodes 210 and the second sensing electrodes 230 such that visibility in a boundary area between the first sensing electrodes 210 and the second sensing electrodes 230 may be reduced.

Figure 6:
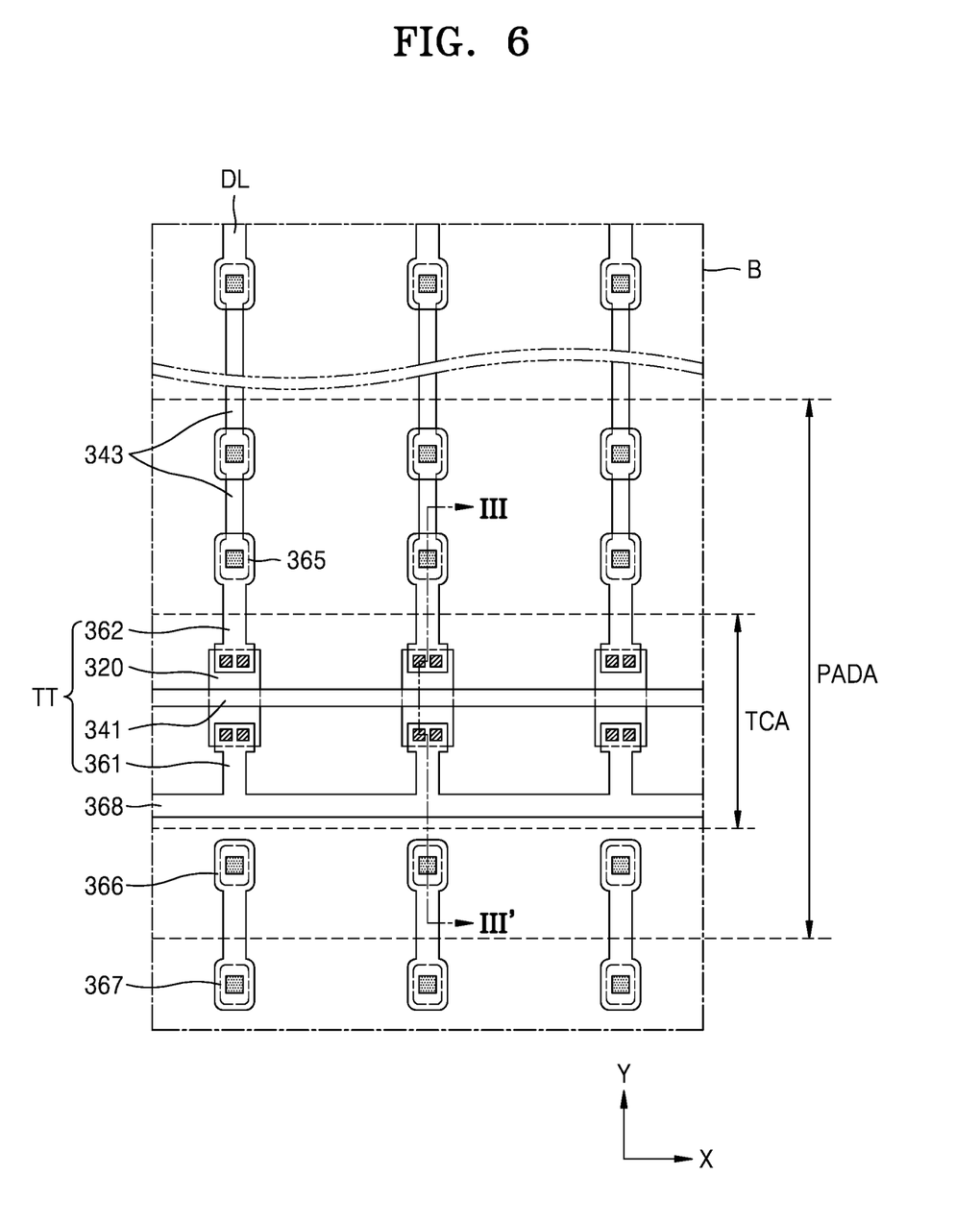
FIG. 6 is a plan view illustrating a region "B" of FIG. 2.
Figure 7:
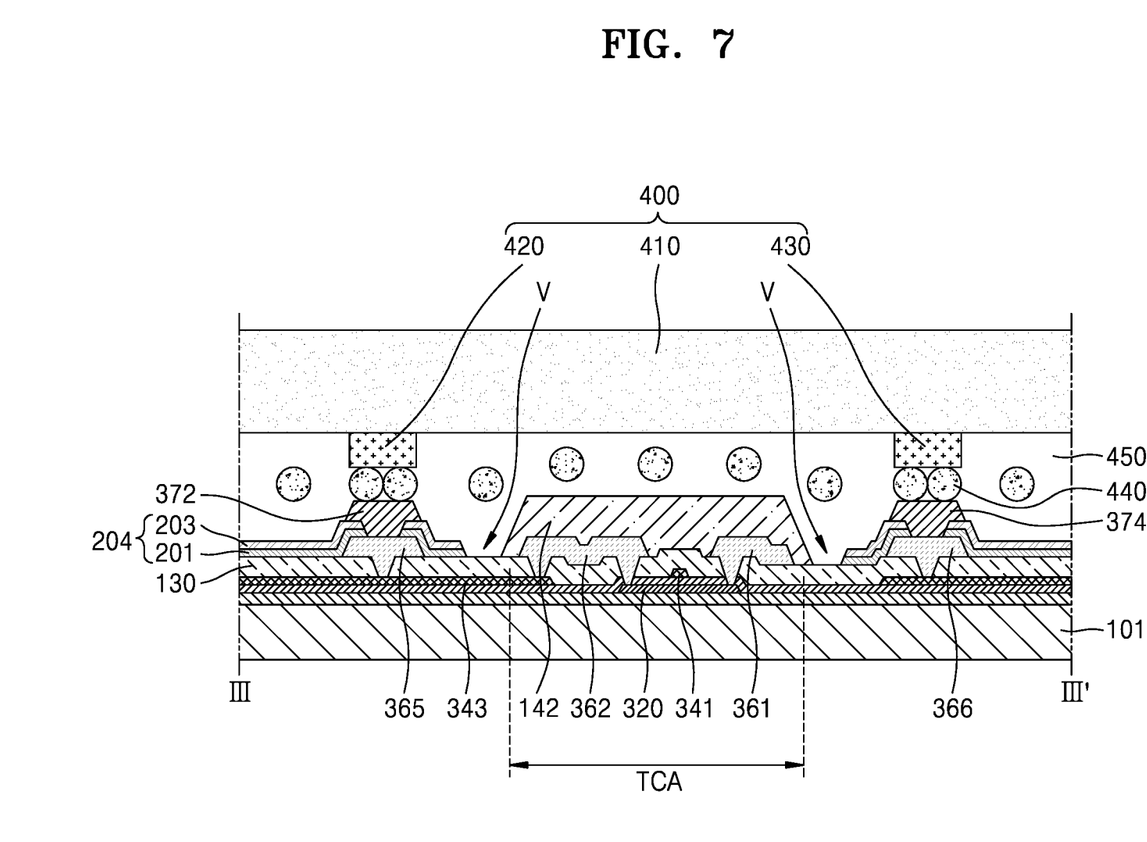
FIG. 7 is a cross-sectional view taken along the line III-III' of FIG. 6.

FIG. 6 is a plan view illustrating a region "B" of FIG. 2; and FIG. 7 is a cross-sectional view taken along the line III-III' of FIG. 6.

Referring to FIGS. 6 and 7, a testing circuit unit, or testing circuit, TCA may be disposed in the pad area PADA, and the testing circuit unit TCA may include a plurality of transistors TT. The plurality of transistors TT may be transistors for testing whether pixels operate ordinarily.

In an embodiment, each of the plurality of transistors TT may have the same structure as that of the thin-film transistor (see TFT of FIG. 3) within the display area (see DA of FIG. 2). In an embodiment, each of the plurality of transistors TT may include a semiconductor layer 320 including amorphous silicon, polycrystalline silicon, or an organic semiconductor material, a gate electrode 341 on the semiconductor layer 320, a source electrode 361 connected to the semiconductor layer 320, and a drain electrode 362.

Each of the plurality of transistors TT may be electrically connected to a data line DL of a plurality of corresponding data lines DL that extend to cross the display area (see DA of FIG. 2) in the second direction, and the gate electrodes 341 of the plurality of transistors TT may be connected to one another. That is, the gate electrodes 341 of the plurality of transistors TT may be configured as one gate line that extends in the first direction X. Thus, when electrical signals are concurrently (e.g., simultaneously) applied to the connected gate electrodes 341 of the plurality of transistors TT, channels are concurrently (e.g., simultaneously) formed in the semiconductor layers 320 of the plurality of transistors TT. In this way, when the plurality of transistors TT are simultaneously turned on, the electrical signals from a test signal line 368 may be transmitted to the plurality of data lines DL, and pixels in the display area (see DA of FIG. 2) electrically connected to the plurality of data lines DL emit light to check whether the pixels in the display area DA are defective.

The drain electrode 362 of the transistor TT may be connected to the corresponding data line DL via a connection wire 343. In an embodiment, the connection wire 343 may include a same material as the gate electrode 341 and may be disposed on a same layer as the gate electrode 341. Also, the source electrodes 362 of the transistors TT may be connected to the test signal line 368 that extends in the first direction X. In an example, the source electrodes 362 may be an integral part with the test signal line 368.

As shown in FIGS. 6 and 7, a plurality of output pads 365 and input pads 366 may be disposed in the pad area PADA.

The plurality of output pads 365 may be arranged between the testing circuit unit TCA and the display area (see DA of FIG. 2) in the first direction X. Each of the plurality of output pads 365 may be disposed on the corresponding connection wires 343 and may be in contact therewith. In an embodiment, each of the plurality of output pads 365 may include a same material as the source electrode 361 and the drain electrode 362 of the transistor TT and may be connected to the connection wires 343 via a contact hole formed in the interlayer insulating layer 130.

The plurality of input pads 366 may be disposed at an opposite side to the plurality of output pads 365 with the testing circuit unit TCA therebetween. The plurality of input pads 366 may be arranged in the first direction X. In an embodiment, each of the plurality of input pads 366 may include a same material as the plurality of output pads 365 and may be disposed on a same layer as the plurality of output pads 365.

The output pads 365 and the input pads 366 may be covered by a protective layer 204. The protective layer 204 may include at least one of the first touch insulating layer 201 and the second touch insulating layer 203. Thus, herein, "the first touch insulating layer 201 and the second touch insulating layer 203," "the first touch insulating layer 201" or "the second touch insulating layer 203" may be used to refer to the protective layer 204. In FIG. 7, both the first touch insulating layer 201 and the second touch insulating layer 203 are shown covering the output pads 365 and the input pads 366. However, embodiments are not limited thereto, and the first touch insulating layer 201 or the second touch insulating layer 203 may cover the output pads 365 and the input pads 366. In an embodiment, additional input pads 374 and additional output pads 372 may be formed on the second touch insulating layer 203 so as to overlap the input pads 366 and the output pads 365.

The additional input pads 374 may be connected to the input pads 366 via a contact hole formed in the first touch insulating layer 201 and the second touch insulating layer 203, and the additional output pads 372 may be connected to the output pads 365 via a contact hole formed in the first touch insulating layer 201 and the second touch insulating layer 203. In an embodiment, the additional input pads 374 and the additional output pads 372 may include a same material as the first sensing electrodes (see 210 of FIG. 4) and the second sensing electrodes (see 230 of FIG. 4) of the input sensing unit (see 200 of FIG. 4).

The additional input pads 374 and the additional output pads 372 may be connected to a driving chip 400 mounted in the pad area PADA. The driving chip 400 includes a body 410, an output bump 420, and an input bump 430. In FIG. 7, one output bump 420 and one input bump 430 are illustrated in the driving chip 400. However, the driving chip 400 may include a plurality of output bumps 420 and a plurality of input bumps 430. The driving chip 400 may be an integrated circuit (IC) chip, for example.

The additional input pad 374 may be connected to the input bump 430 of the driving chip 400, and the additional output pad 372 may be connected to the output bump 420 of the driving chip 400. Thus, when the display device is actually driven, electrical signals from the driving chip 400 may be transmitted from the output bump 420 to the data lines DL via the output pads 365 and the connection wires 343 and ultimately to a plurality of pixels in the display area (see DA of FIG. 2). Information about an image to be realized in the display area (see DA of FIG. 2) may be inputted to the driving chip 400 via the input bump 430 of the driving chip 400. To this end, in an embodiment, the display device may include another input pad 367 connected to the input pad 366. A printed circuit board (PCB) may be electrically connected to another input pad 367.

The driving chip 400 may be mounted in the pad area PADA after being compressed at a high temperature after an anisotropic conductive film in which conductive balls 440 are dispersed in an adhesive insulation resin layer 450, is interposed between the driving chip 400 and the pad area PADA. In this case, the conductive balls 440 may send an electric current to the input bump 430 and the additional input pad 374 and may send an electric current to the output bump 420 and the additional output pad 372. When the additional input pad 374 and the additional output pad 372 are not formed, the input bump 430 and the output bump 420 may be connected to the input pad 366 and the output pad 365 via the conductive balls 440.

As the input bump 430 of the driving chip 400 is electrically connected to the input pad 366, and the output bump 420 of the driving chip 400 is electrically connected to the output pad 365, the driving chip 400 is disposed on the testing circuit unit TCA, as shown in FIG. 7. Thus, in order to prevent or substantially prevent damage of the transistor TT when the driving chip 400 is mounted, the testing circuit unit TCA may be covered by a cover layer, or cover part, 142. In an embodiment, the cover layer 142 may be formed together with the formation of the planarization layer (see 140 of FIG. 3) and may include a same material as the planarization layer (see 140 of FIG. 3).

In an embodiment, when the first touch insulating layer 201 and the second touch insulating layer 203 are formed on the entirety of the pad area PADA so as to cover the cover layer 142, when the driving chip 400 is mounted, the first touch insulating layer 201 and the second touch insulating layer 203 on the cover layer 142 are pressed by the conductive balls 440. Thus, damage, such as a crack, may occur in the first touch insulating layer 201 and the second touch insulating layer 203. Also, when moisture penetrates into the cover layer 142 through the crack, the cover layer 142 may thermally expand, and interfacial segregation between the first touch insulating layer 201 and the interlayer insulating layer 130 may occur in the vicinity of the cover layer 142, and the penetrating moisture may move to the adjacent output pad 365 such that a fine dark point or dark line may be realized in the display area (see DA of FIG. 2).

Thus, to prevent or substantially prevent this problem, in an embodiment, a valley part V is formed around the cover layer 142 in the pad area PADA. Thus, even when the cover layer 142 expands, interfacial segregation between the first touch insulating layer 201 and the interlayer insulating layer 130 may be realized. In an embodiment, the valley part V may be disposed at least between the testing circuit unit TCA and the plurality of output pads 365 and between the testing circuit unit TCA and the plurality of input pads 366.

The valley part V may be an area in which a part of the first touch insulating layer 201 and the second touch insulating layer 203 is removed, and, in the valley part V, the interlayer insulating layer 130 may be in direct contact with the adhesive insulation resin layer 450. However, embodiments are not limited thereto. The first touch insulating layer 201 or the second touch insulating layer 203 may cover the output pad 365 and the input pad 366, as described above. In this case, the valley part V may be formed by removing a part of the first touch insulating layer 201 or the second touch insulating layer 203. In an embodiment, an additional insulating layer in addition to the first touch insulating layer 201 and the second touch insulating layer 203 may be formed to cover the output pad 365 and the input pad 366. In this case, the valley part V may be formed by removing the first touch insulating layer 201, the second touch insulating layer 203, and the additional insulating layer.

In order to mount the driving chip 400 in the pad area PADA, the driving chip 400 is thermally pressed. In this case, a stress in which the substrate 101 may be bent by an applied force, is generated. The stress may be concentrated on the valley part V having a concave shape. Thus, cracks may occur in the interlayer insulating layer 130 at a point corresponding to the valley part V. The cracks may propagate along the interlayer insulating layer 130 such that damage may occur in the display panel (see 100 of FIG. 2) Thus, in an embodiment, the valley part V is formed in a position in which a minimum stress may be applied to the display panel (see 100 of FIG. 2) when the driving chip 400 is mounted.

The following Table 1 shows results of measuring a stress applied to the substrate 101 according to a distance between the cover layer 142 and the valley part V when the driving chip 400 is mounted. Here, the distance between the cover layer 142 and the valley part V is a distance between an end of the cover layer 142 to a starting point of the valley part V. The cover layer 142 and the valley part V that are apart from each other refers to the first touch insulating layer 201 and the second touch insulating layer 203 being disposed between the cover layer 142 and the valley part V.

TABLE 1

| Example/ Embodiment | Distance between cover layer and valley part (μm) | Stress (MPa) |
|---|---|---|
| 1 | — | 103 |
| 2 | 0 | 123 |
| 3 | 5 | 140 |
| 4 | 10 | 147 |
| 5 | 15 | 156 |
| 6 | 20 | 162 |

In Table 1 above, Example 1 is a case in which no valley part V is formed. However, when the valley part V is not formed, as described above, a fine dark point or dark line may be presented in the display area (see DA of FIG. 2). Thus, in embodiments, the valley part V is formed.

Comparing Embodiments 2 through 6 with one another, as the distance between the cover layer 142 and the valley part V increases, the size of the stress that occurs in a position corresponding to the valley part V may increase. Thus, the valley part V may be formed to be disposed subsequent to the end of the cover layer 142, as shown in FIG. 7. This means that the first touch insulating layer 201 and the second touch insulating layer 203 do not exist between the end of the cover layer 142 and the valley part V, and, on the plane, ends of the first touch insulating layer 201 and the second touch insulating layer 203 are apart from the cover layer 142.

In this way, when the valley part V is disposed subsequent to the end of the cover layer 142, the stress concentrated on the valley part V when the driving chip 400 is mounted may be alleviated by the cover layer 142 formed of an organic material. Thus, even when the valley part V for preventing or substantially preventing expression of the fine dark point or dark line is formed in the display area (see DA of FIG. 2), the occurrence of damage in the display panel (see 100 of FIG. 2) when the driving chip 400 is mounted, may be minimized or reduced. FIG. 7 illustrates an example in which the first touch insulating layer 201 and the second touch insulating layer 203 are not formed on the cover layer 142. However, when the valley part V is formed around the cover layer 142, even when damage occurs in the first touch insulating layer 201 and the second touch insulating layer 203 on the cover layer 142, the above-described problem does not occur. Thus, when the valley part V is formed, the first touch insulating layer 201 and the second touch insulating layer 203 may be formed on the cover layer 142.

According to embodiments of the present disclosure, a display device in which the occurrence of damage in a display panel may be minimized or reduced when a driving IC is mounted, is provided.

It is to be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as set forth in the following claims.

What is claimed is:

1. A display device comprising:
a substrate comprising a display area, a peripheral area outside the display area, and a pad area within the peripheral area;
a testing circuit unit disposed within the pad area;
a cover layer covering the testing circuit unit;
an output pad disposed within the pad area and arranged between the testing circuit unit and the display area;
an input pad disposed within the pad area, disposed at an opposite side in a second direction with respect to the output pad with the testing circuit unit therebetween; and
a protective layer covering the output pad and the input pad,
wherein, on a plane, each of the input pad and an end of the protective layer is spaced apart from the cover layer along the second direction, and
wherein the second direction is a direction in which the output pad, the testing circuit unit, and the input pad are sequentially arranged.

2. The display device of claim 1, wherein
the testing circuit unit comprises a plurality of transistors, and
gate electrodes of the plurality of transistors are electrically connected to one another.

3. The display device of claim 2, wherein the gate electrodes are configured as a gate line that extends in a first direction perpendicular to the second direction.

4. The display device of claim 3, further comprising a plurality of data lines that extend to cross the display area in the second direction, wherein each of the plurality of transistors is electrically connected to a corresponding data line of the plurality of data lines.

5. The display device of claim 2, further comprising
a driving chip comprising an input bump and an output bump and arranged in the pad area; and an adhesive insulation resin layer in which conductive balls are dispersed, the adhesive insulation resin layer disposed between the pad area and the driving chip, wherein the input bump is electrically connected to the input pad via the conductive balls, and the output bump is electrically connected to the output pad via the conductive balls.

6. The display device of claim 5, wherein the driving chip is disposed on the cover layer.

7. The display device of claim 5, wherein each of the plurality of transistors further comprises a source electrode and a drain electrode, which are disposed on the gate electrode, an interlayer insulating layer is disposed between the gate electrode and the source electrode and the drain electrode, and the input pad and the output pad are disposed on the interlayer insulating layer.

8. The display device of claim 7, wherein the interlayer insulating layer is in direct contact with the adhesive insulation resin layer, between the end of the protective layer and the cover layer.

9. The display device of claim 1, further comprising:

a display panel comprising the substrate, and an input sensing unit on the display panel, wherein the input sensing unit comprises a first touch insulating layer disposed on the display panel, a bridge wire on the first touch insulating layer, a second touch insulating layer on the bridge wire, and a first sensing electrode and a second sensing electrode on the second touch insulating layer, and the protective layer comprises at least one of the first touch insulating layer and the second touch insulating layer.

10. The display device of claim 9, further comprising:

an additional output pad disposed on the protective layer and connected to the output pad, and an additional input pad disposed on the protective layer and connected to the input pad, wherein the additional output pad and the additional input pad comprise a same material as the first sensing electrode and the second sensing electrode.

11. A display device comprising:

a display panel;

an input sensing unit disposed on the display panel; and a driving chip mounted on the display panel, wherein the display panel comprises:

a substrate comprising a display area, a peripheral area outside the display area, and a pad area within the peripheral area;

a testing circuit unit disposed within the pad area;

a cover layer covering the testing circuit unit;

an output pad disposed within the pad area and arranged between the testing circuit unit and the display area; and an input pad disposed at an opposite side in a second direction with respect to the output pad with the testing circuit unit therebetween, wherein the driving chip is disposed on the cover layer, and an input bump of the driving chip is electrically connected to the input pad, and an output bump of the driving chip is electrically connected to the output pad, and on a plane, the input pad is spaced apart from the cover layer along the second direction, wherein the second direction is a direction in which the output pad, the testing circuit unit, and the input pad are sequentially arranged.

12. The display device of claim 11, wherein the display panel further comprises a protective layer covering the output pad and the input pad, and an end of the protective layer around the cover layer is apart from the cover layer.

13. The display device of claim 12, wherein the input sensing unit comprises a first touch insulating layer disposed on the display panel, a bridge wire on the first touch insulating layer, a second touch insulating layer on the bridge wire, and a first sensing electrode and a second sensing electrode on the second touch insulating layer, and the protective layer comprises at least one of the first touch insulating layer and the second touch insulating layer.

14. The display device of claim 13, wherein the display panel further comprises an additional output pad disposed on the protective layer and connected to the output pad, and an additional input pad disposed on the protective layer and connected to the input pad, and the additional output pad and the additional input pad comprise a same material as the first sensing electrode and the second sensing electrode.

15. The display device of claim 11, wherein the display panel further comprises a thin-film transistor disposed within the display area, an organic light-emitting device electrically connected to the thin-film transistor, and a planarization layer between the thin-film transistor and the organic light-emitting device, and the cover layer comprises a same material as the planarization layer.

16. The display device of claim 11, wherein the testing circuit unit comprises a plurality of transistors, and gate electrodes of the plurality of transistors are configured as a gate line that extends in a first direction perpendicular to the second direction.

17. The display device of claim 16, wherein the display panel further comprises a plurality of data lines that extend to cross the display area in the second direction, and each of the plurality of transistors is electrically connected to a corresponding data line of the plurality of data lines.

18. The display device of claim 16, further comprising an adhesive insulation resin layer in which conductive balls are dispersed, the adhesive insulation resin layer disposed between the pad area and the driving chip, and the input bump is electrically connected to the input pad via the conductive balls, and the output bump is electrically connected to the output pad via the conductive balls.

19. The display device of claim 18, wherein each of the plurality of transistors further comprises a source electrode and a drain electrode, which are disposed on the gate electrode, an interlayer insulating layer is disposed between the gate electrode and the source electrode and the drain electrode, and the input pad and the output pad are disposed on the interlayer insulating layer.

20. The display device of claim 19, wherein the interlayer insulating layer is in direct contact with the adhesive insulation resin layer, between an end of a protective layer and the cover layer, the protective layer covering the output pad and the input pad.

* * * * *